US009786646B2

United States Patent
Cok et al.

(10) Patent No.: US 9,786,646 B2
(45) Date of Patent: Oct. 10, 2017

(54) MATRIX ADDRESSED DEVICE REPAIR

(71) Applicant: X-Celeprint Limited, Cork (IE)

(72) Inventors: Ronald S. Cok, Rochester, NY (US);
Christopher Bower, Raleigh, NC (US);
Matthew Meitl, Durham, NC (US);
António José Marques Trindade, Cork (IE)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 0 days.

(21) Appl. No.: 15/040,810

(22) Filed: Feb. 10, 2016

(65) Prior Publication Data

US 2017/0186740 A1 Jun. 29, 2017

Related U.S. Application Data

(60) Provisional application No. 62/387,189, filed on Dec. 23, 2015.

(51) Int. Cl.
*H01L 27/02* (2006.01)
*H01L 23/528* (2006.01)
(Continued)

(52) U.S. Cl.
CPC .......... *H01L 27/0207* (2013.01); *H01L 22/14* (2013.01); *H01L 22/32* (2013.01);
(Continued)

(58) Field of Classification Search
CPC ..... H01L 27/0207; H01L 22/14; H01L 33/62; H01L 25/167; H01L 22/32; H01L 23/528; H01L 2933/0066
See application file for complete search history.

(56) References Cited

U.S. PATENT DOCUMENTS 5,550,066 A 8/1996 Tang et al.
5,621,555 A 4/1997 Park
(Continued)

FOREIGN PATENT DOCUMENTS

WO WO-2006/027730 A1 3/2006
WO WO-2006/099741 A1 9/2006
(Continued)

OTHER PUBLICATIONS

Hamer et al., 63.2: AMOLED Displays Using Transfer-Printed Integrated Circuits, SID 09 Digest, 947-950 (2009).
(Continued)

*Primary Examiner* — Roy Potter
*Assistant Examiner* — Paul Patton
(74) *Attorney, Agent, or Firm* — Choate, Hall & Stewart LLP; William R. Haulbrook

(57) ABSTRACT

A repairable matrix-addressed system includes a system substrate, an array of electrically conductive row lines, and an array of electrically conductive column lines disposed over the system substrate. The row lines extend over the system substrate in a row direction and the column lines extend over the system substrate in a column direction different from the row direction to define an array of non-electrically conductive intersections between the row lines and the column lines. An array of electrically conductive line segments is disposed over the system substrate. The line segments extend over the system substrate substantially parallel to the row direction and have a line segment length that is less than the distance between adjacent column lines. Each line segment is electrically connected to a column line. One or more devices are electrically connected to each row line and to each line segment adjacent to the row line.

31 Claims, 14 Drawing Sheets

(51) Int. Cl.
*H01L 21/66* (2006.01)
*H01L 33/62* (2010.01)
*H01L 25/16* (2006.01)

(52) U.S. Cl.
CPC .......... *H01L 23/528* (2013.01); *H01L 25/167* (2013.01); *H01L 33/62* (2013.01); *H01L 2933/0066* (2013.01)

(56) References Cited

U.S. PATENT DOCUMENTS

| | | |
|---|---|---|
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,340 B2 | 5/2002 | Yoneda et al. |
| 6,466,281 B1 | 10/2002 | Huang et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,946,760 B2 | 2/2015 | Kim |
| 8,987,765 B2 | 3/2015 | Bibl et al. |
| 9,202,996 B2 | 12/2015 | Orsley et al. |
| 2001/0022564 A1 | 9/2001 | Youngquist et al. |
| 2002/0096994 A1 | 7/2002 | Iwafuchi et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0275615 A1 | 12/2005 | Kahen et al. |
| 2005/0285246 A1 | 12/2005 | Haba et al. |
| 2006/0051900 A1 | 3/2006 | Shizuno |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2009/0315054 A1 | 12/2009 | Kim et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0190293 A1 | 7/2010 | Maeda et al. |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0289115 A1 | 11/2010 | Akiyama et al. |
| 2010/0317132 A1 | 12/2010 | Rogers et al. |
| 2011/0211348 A1 | 9/2011 | Kim |
| 2012/0119249 A1 | 5/2012 | Kim et al. |
| 2012/0223875 A1 | 9/2012 | Lau et al. |
| 2012/0228669 A1 | 9/2012 | Bower et al. |
| 2012/0314388 A1 | 12/2012 | Bower et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0348926 A1 | 12/2015 | Bower |

(56) References Cited

U.S. PATENT DOCUMENTS

| | | |
|---|---|---|
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |

FOREIGN PATENT DOCUMENTS

| | | |
|---|---|---|
| WO | WO-2008/103931 A2 | 8/2008 |
| WO | WO-2010/032603 A1 | 3/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

Lee, S. H. etal, Laser Lift-Offof GaN Thin Film and its Application to the Flexible Light Emitting Diodes, Proc. of SPIE 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Yaniv et al., A 640 × 480 Pixel Computer Display Using Pin Diodes with Device Redundancy, 1988 International Display Research Conference, IEEE, CH-2678-1/88:152-154 (1988).

MATRIX ADDRESSED DEVICE REPAIR

RELATED APPLICATIONS

This application claims priority to and the benefit of U.S. Provisional Patent Application No. 62/387,189, filed Dec. 23, 2015, titled Matrix-Addressed Device Repair, the contents of which are incorporated by reference herein in its entirety.

Reference is made to commonly assigned U.S. patent application Ser. No. 14/743,788 entitled Micro Assembled LED Displays and Lighting Elements by Bower et al, U.S. patent application Ser. No. 14/822,864 entitled Chiplets with Connection Posts by Prevatte et al., and U.S. patent application Ser. No. 14/807,226 entitled Parallel Redundant Chiplet System by Cok et al., the disclosures of which are incorporated herein by reference in their entirety.

FIELD OF THE INVENTION

The present invention relates to structures and methods for providing robust and repairable matrix-addressed systems and to micro-transfer printing devices onto such matrix-addressed system.

BACKGROUND OF THE INVENTION

Substrates with electronically active components distributed over the extent of the substrate may be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed on a flat-panel substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photolithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and increased material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Publication No. 2010/0289115 and U.S. Patent Publication No. 2010/0123134. However, such substrate materials can be more expensive or difficult to process.

In further manufacturing techniques, a mono-crystalline semiconductor wafer is employed as the substrate. While this approach can provide substrates with the same performance as integrated circuits, the size of such substrates may be limited, for example, to a 12-inch diameter circle, the wafers are relatively expensive compared to other substrate materials such as glass, polymer, or quartz, and the wafers are rigid.

A variety of other methods are used for distributing electronically functional components over a substrate in the circuit board assembly industry include, for example, pick-and-place technologies for integrated circuits provided in a variety of packages such as pin-grid arrays, ball-grid arrays, and flip-chips. However, these techniques may be limited in the size of the integrated circuits that can be placed so that the integrated circuits and their packaging can be larger than is desired.

Another method for transferring active components from one substrate to another is described in U.S. Pat. No. 7,943,491. In this approach, small integrated circuits are formed on a semiconductor wafer. The small integrated circuits, or chiplets, are released from the wafer by etching a layer formed beneath the circuits. A PDMS stamp is pressed against the wafer and the process side of the chiplets is adhered to the stamp. The chiplets are pressed against a destination substrate or backplane and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In some cases, however, not all of the elements are transferred from the wafer to the destination substrate by the stamp, for example, due to process abnormalities or undesired particles on the stamp, the wafer, or the destination substrate. It is also possible that the elements themselves are defective due to materials or manufacturing process errors in the wafer. Such problems can reduce manufacturing yields, increase product costs, and necessitate expensive repair or rework operations.

The electrical connections between the small integrated circuits and the backplane contact pads are typically made by photolithographic processes in which a metal is evaporated or sputtered onto the small integrated circuits and the destination substrate to form a metal layer; the metal layer is coated with a photoresist that is exposed to a circuit connection pattern and the metal layer and photoresist are developed by etching and washing to form the patterned electrical connections between the small integrated circuits and the connection pads on the destination substrate. Additional layers, such as interlayer dielectric insulators, can also be required. This process is expensive and requires a number of manufacturing steps. Moreover, the topographical structure of the small integrated circuits over the destination substrate renders the electrical connections problematic; for example it can be difficult to form a continuous conductor from the destination substrate to the small integrated circuit because of the differences in height over the surface between the small integrated circuits and the destination substrate.

Some electronic systems, such as displays, use arrays of devices that are typically controlled with either a passive-matrix (PM) control employing electronic circuitry external to the display substrate or an active-matrix (AM) control employing electronic circuitry formed directly on the display substrate and storing data associated with each light-emitting element. Both OLED displays and LCDs using passive-matrix control and active-matrix control are available. An example of such an AM OLED display device is disclosed in U.S. Pat. No. 5,550,066.

Typically, in an active-matrix-controlled display, each display sub-pixel is controlled by one control element, and each control element includes at least one transistor. For example, in a simple active-matrix OLED display, each control element includes two transistors (a select transistor and a drive transistor) and one capacitor for storing a charge specifying the desired luminance of the sub-pixel. Each OLED element employs an independent control electrode connected to the power transistor and a common electrode. In contrast, an LCD typically uses a single-transistor circuit. Control of the light-emitting elements is usually provided through a data signal line, a select signal line, a power connection and a ground connection. Active-matrix elements are not necessarily limited to displays and can be distributed over a substrate and employed in other applications requiring spatially distributed control.

Active-matrix circuitry is commonly achieved by forming thin-film transistors (TFTs) in a semiconductor layer formed on a display substrate and employing a separate TFT circuit to control each light-emitting pixel in the display. The semiconductor layer is typically amorphous silicon or polycrystalline silicon and is distributed over the entire flat-panel display substrate. The semiconductor layer is photolithographically processed to form electronic control elements, such as transistors and capacitors. Additional layers, including insulating dielectric layers and conductive metal layers, are provided, often by evaporation or sputtering, and photolithographically patterned to form electrical interconnections, structures, or wires.

Surface-mount devices (SMDs) are an alternative way to provide electrical elements on a substrate or backplane. Such devices, as their name suggests, include electrical connections that are typically placed on the surface and in contact with a backplane rather than including pins that extend through vias in the backplane. Surface-mount technology (SMT) is widely used in the electronics industry to provide high-density printed-circuit boards (PCBs). In particular, a well-developed and inexpensive infrastructure exists for making and integrating two-terminal surface-mount devices, such as resistors or capacitors, into printed circuit boards. However, the smallest surface-mount device readily available is several hundred microns long and wide, precluding their use for applications requiring integrated circuits with circuit elements having a size of several microns, or less.

There is a need, therefore, for structures and methods that enable the electrical interconnection of small integrated circuits, such as micro transfer printed chiplets, to destination substrates and that provide a matrix-addressed system with small high-resolution elements that is tolerant of manufacturing and materials variability and particle contamination and enables repair.

SUMMARY OF THE INVENTION

In accordance with embodiments of the present invention, a repairable matrix-addressed system comprises: a system substrate; an array of electrically conductive row lines disposed over the system substrate, the row lines extending over the system substrate in a row direction; an array of electrically conductive column lines disposed over the system substrate, the column lines extending over the system substrate in a column direction different from the row direction defining an array of non-electrically conductive intersections between the row lines and the column lines; an array of electrically conductive line segments disposed over the system substrate, the line segments extending over the system substrate substantially parallel to the row direction, the line segments having a line segment length that is less than the distance between adjacent column lines, and each line segment electrically connected to a column line; and one or more devices electrically connected to each column line and to each line segment adjacent to the row line.

In accordance with another embodiment of the present invention, a repairable matrix-addressed system comprises: a system substrate; an array of electrically conductive row lines disposed over the system substrate, the row lines extending over the system substrate in a row direction; an array of electrically conductive column lines disposed over the system substrate, the column lines extending over the system substrate in a column direction different from the row direction defining an array of non-electrically conductive intersections between the row lines and the column lines; and an array of electrically conductive line segments disposed over the system substrate, the line segments extending over the system substrate substantially parallel to the row direction, the line segments having a line segment length that is less than the distance between adjacent columns, and each line segment electrically connected to a column line; wherein the line segment extends for a distance over the system substrate to provide one or more device locations between each pair of adjacent column lines and line segments.

In accordance with yet another embodiment of the present invention, a method of making repairable matrix-addressed system comprises: providing a system substrate: (i) having an array of electrically conductive row lines disposed over the system substrate, the row lines extending over the system substrate in a row direction; (ii) having an array of electrically conductive column lines disposed over the system substrate, the column lines extending over the system substrate in a column direction different from the row direction defining an array of non-electrically conductive intersections between the row lines and the column lines; and (iii) having an array of electrically conductive line segments disposed over the system substrate, the line segments extending over the system substrate substantially parallel to the row direction, the line segments having a line segment length that is less than the distance between adjacent columns, and each line segment electrically connected to a column line; and disposing one or more devices on the system substrate so that the one or more devices are electrically connected to each column line and to each line segment. The devices can be disposed by micro-transfer printing and the electrical connection can be made by pressing a conductive post on the devices into the row line and pressing another conductive post on the device into the line segment.

In further embodiments of the present invention, the devices are tested to determine any failed device and an additional device is added between the line segment and row line corresponding to any failed device. The additional device can be added between the failed device and its corresponding column line or on a side of the column line opposite the failed device. In yet another embodiment, the line segment between a failed device and the column line is cut to electrically isolate the failed device.

In an alternative embodiment, a redundant device is provided between each line segment and column line.

The present invention provides systems including arrays of devices on a substrate that are addressed using matrix-addressing methods such as passive-matrix addressing and active-matrix addressing. The systems can be robust in the presence of manufacturing variability and particle contamination and provide simple and robust electrical interconnections. The systems can also employ small integrated circuits at a high resolution that are transfer printed on a system substrate.

In certain embodiments, the disclosed technology includes a repairable matrix-addressed system, the system including: a system substrate; an array of electrically conductive row lines disposed over the system substrate, the row lines extending over the system substrate in a row direction; an array of electrically conductive column lines disposed over the system substrate, the column lines extending over the system substrate in a column direction different from the row direction defining an array of non-electrically conductive intersections between the row lines and the column lines; an array of electrically conductive line segments disposed over the system substrate, the line segments extending over the system substrate substantially parallel to the row direction, the line segments having a line segment length that is less than the distance between adjacent column lines, and each line segment electrically connected to a column line; and one or more devices electrically connected to each row line and to each line segment adjacent to the row line.

In certain embodiments, one or more of the line segments extends to both sides of the column line to which it is electrically connected.

In certain embodiments, one or more devices are provided on each side of the column line to which the line segment is electrically connected.

In certain embodiments, one or more of the line segments extends substantially to one side of the column line to which it is electrically connected.

In certain embodiments, two or more devices are provided on only one side of the column line to which the line segment is electrically connected.

In certain embodiments, two devices are electrically connected between one of the line segments and one of the row lines and comprising a cut in the line segment between two of the devices that electrically disconnects one of the devices from the column line.

In certain embodiments, one of the two devices is defective.

In certain embodiments, the device farthest from the column line is defective.

In certain embodiments, the device nearest the column line is defective and comprising an electrical connector electrically connecting the device farthest from the column line to the column line.

In certain embodiments, three devices are electrically connected between one of the line segments and one of the row lines and comprising two cuts in the line segment between adjacent pairs of the devices that electrically disconnects two of the devices from the column line.

In certain embodiments, the devices comprise a substrate and first and second electrically conductive connection posts protruding from the system substrate, the first posts forming the electrical connection between the device and the row line and the second post forming the electrical connection between the device and the line segment.

In certain embodiments, the row line and the line segment are disposed on or in the surface of the system substrate and wherein the first or second connection posts extend onto, into, or through the row line or line segment, respectively.

In certain embodiments, the row line and the line segment are disposed on or in the surface of the system substrate and wherein the first or second connection posts are soldered to the row line or the line segment, respectively.

In certain embodiments, the system including a non-conductive adhesive adhering the device to the system substrate, to the row line, or to the column line.

In certain embodiments, the adhesive is at least partially disposed between the first and second posts.

In certain embodiments, the devices are bare die, integrated circuits, unpackaged integrated circuits, transducers, light emitters, light-emitting diodes, micro-light-emitting diodes, sensors, capacitive sensors, touch sensors, photo-sensors, electromagnetic radiation sensors, or piezo-electric sensors.

In certain embodiments, the devices are modules including one or more electrically or optically connected elements having element substrates and wherein the elements include one or more bare die, integrated circuits, unpackaged integrated circuits, transducers, light emitters, light-emitting diodes, micro-light-emitting diodes, sensors, capacitive sensors, touch sensors, photo-sensors, electromagnetic radiation sensors, or piezo-electric sensors, the module having a module substrate separate from the element substrates.

In certain embodiments, the modules each comprise a module substrate or a semiconductor module substrate on or in which a module circuit is formed, the module circuit electrically or optically connected to one or more of the elements.

In certain embodiments, the system is a passive-matrix system.

In certain embodiments, the devices include electronic or optical circuitry.

In certain embodiments, system is an active-matrix system.

In certain embodiments, the row lines and the line segments are in a common layer and are equally exposed or are covered with the same layers.

In certain embodiments, the system includes contact pads on the system substrate electrically connected to the row lines or the line segments and the devices are electrically connected to the contact pads.

In certain embodiments, the contact pads comprise different materials or materials in different combinations than the row lines or the line segments.

In another aspect, the disclosed technology includes a repairable matrix-addressed system, the system including: a system substrate; an array of electrically conductive row lines disposed over the system substrate, the row lines extending over the system substrate in a row direction; an array of electrically conductive column lines disposed over the system substrate, the column lines extending over the system substrate in a column direction different from the row direction defining an array of non-electrically conductive intersections between the row lines and the column lines; and an array of electrically conductive line segments disposed over the system substrate, the line segments extending over the system substrate substantially parallel to the row direction, the line segments having a line segment length that is less than the distance between adjacent columns, and each line segment electrically connected to a column line; wherein the line segment extends for a distance over the system substrate to provide one or more device locations for each pair of adjacent row lines and line segments.

In another aspect, the disclosed technology includes a method of making a repairable matrix-addressed system, the method including: providing a system substrate: (i) having an array of electrically conductive row lines disposed over the system substrate, the row lines extending over the system substrate in a row direction, (ii) having an array of electrically conductive column lines disposed over the system substrate, the column lines extending over the system substrate in a column direction different from the row direction defining an array of non-electrically conductive intersections between the row lines and the column lines, and (iii) having an array of electrically conductive line segments disposed over the system substrate, the line segments extending over the system substrate substantially parallel to the row direction, the line segments having a line segment length that is less than the distance between adjacent columns, and each line segment electrically connected to a column line; and disposing one or more devices on the system substrate so that the one or more devices are electrically connected to each row line and to each line segment.

In certain embodiments, the devices are disposed using micro-transfer printing.

In certain embodiments, the one or more devices comprise a device substrate and first and second electrically conductive connection posts protruding from the device substrate, and wherein the step of micro-transfer printing forms the electrical connection between the first post and the row line and forms the electrical connection between the second post and the line segment.

In certain embodiments, the one or more devices comprise a device substrate and first and second electrically conductive connection posts protruding from the device substrate, and comprising soldering the first post to the row line and soldering the second post to the line segment.

In certain embodiments, the method includes providing an adhesive between the devices and the system substrate.

In certain embodiments, the method includes curing the adhesive to adhere the devices to the system substrate.

In certain embodiments, the method includes testing the devices to determine any failed device and adding an additional device between the line segment and row line corresponding to any failed device.

In certain embodiments, the method includes adding the additional device between the failed device and its corresponding column line or on a side of the column line opposite the failed device.

In certain embodiments, the method includes cutting the line segment between a failed device and the column line to electrically isolate the failed device.

In certain embodiments, the method includes providing a redundant device between each line segment and column line.

In certain embodiments, the one or more devices includes at least one redundant device and comprising testing the devices to determine any failed device and adding an electrical connector to electrically connect the at least one redundant device to the row or column lines.

In certain embodiments, the method includes cutting the line segment between the failed device and the column line, line segment, or row line to electrically isolate the failed device.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 8 is a schematic illustration according to an alternative embodiment of the present invention having multiple device locations;

Figure 1:
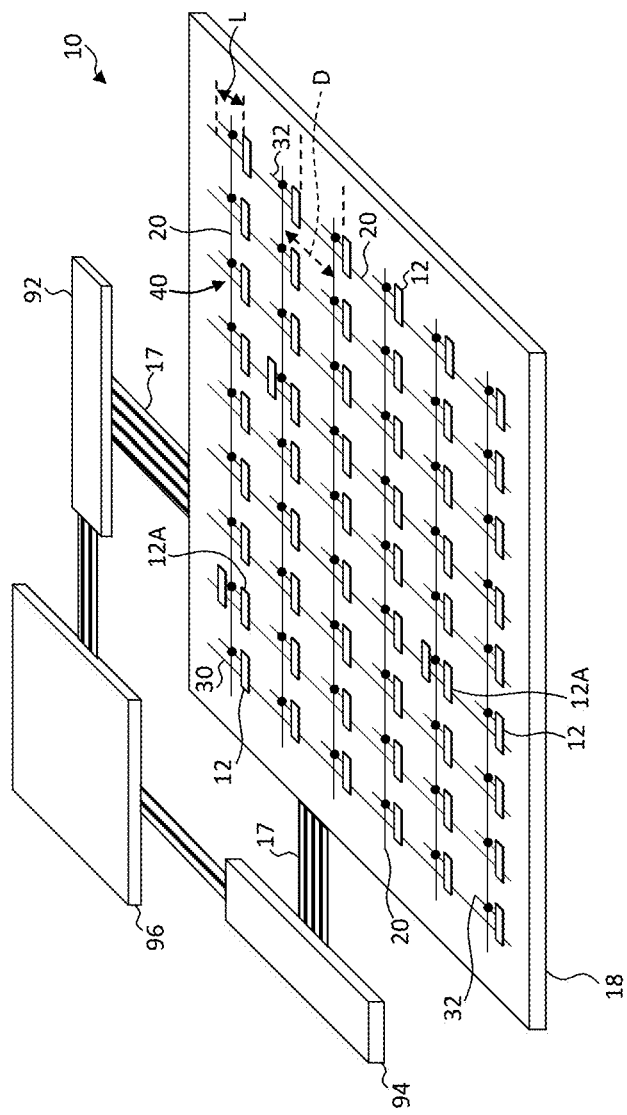
FIG. 1 is a perspective of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides a robust structure and method for providing relatively small high-resolution matrix-addressed devices such as integrated circuit chiplets on a relatively large destination substrate and efficiently and cost-effectively electrically connecting them despite materials and manufacturing process variability and contamination. The structures and methods also provide a way to effectively repair matrix-addressed systems.

Referring to the perspective of FIG. 1, in an embodiment of the present invention, a repairable matrix-addressed system 10 includes a system substrate 18, an array of electrically conductive row lines 30 disposed over the system substrate 18, and an array of electrically conductive column lines 20 disposed over the system substrate 18. The system substrate 18 can be a multi-layer substrate with conductive wires in different layers. The row lines 30 extend over the system substrate 18 in a row direction and the column lines 20 extend over the system substrate 18 in a column direction different from the row direction. In an embodiment, the row direction is orthogonal to the column direction. The row and column lines 30, 20 define an array of non-electrically conductive intersections 40 between the row lines 30 and the column lines 20. The row lines 30 can cross over or under the column lines 20, for example using a conductor in a different layer than the row and column lines 30, 20 that is connected to the row and column lines 30, 20 using a via, for example as is found in printed circuit boards or integrated circuit systems. Alternatively, the row lines 30 can be in a different layer than the column lines 20. As intended herein, an intersection 40 refers to a location where a row line 30 passes over or under a column line 20 over or under the system substrate 18 without coming into electrical contact with the column line 20 at the intersection 40.

An array of electrically conductive line segments 32 is disposed over the system substrate 18, each line segment 32 in association with an intersection 40. The line segments 32 extend over the system substrate 18 substantially parallel to the row direction. The line segments 32 have a line segment length L that is less than the distance D between adjacent column lines 20, and each line segment 32 is electrically connected to a column line 20, for example with an electrical connection 42 such as a via. One or more devices 12 are electrically connected to each row line 30 and to each line segment 32 adjacent to the row line 30, so that the one or more devices 12 are electrically connected to a row line 30 and to a column line 20 providing a matrix-addressed system 10. In an embodiment of the present invention, the row lines 30 and the line segments 32 are in a common layer and are equally exposed, for example, to enable electrically connecting the devices 12 to the row lines 30 and the line segments 32 without requiring additional processing to for one or the other of the row lines 30 and the line segments 32. For example, the row lines 30 and the line segments 32 are equally exposed to the environment or are equally covered with other layers, such as an adhesive layer.

The system substrate 18 can be a printed circuit board, a display substrate, or a glass, metal, ceramic, resin, or polymer substrate. In various embodiments, the devices 12 are bare die, integrated circuits, unpackaged integrated circuits, include electronic circuits, optical circuits, transducers, light emitters, light-emitting diodes, micro-light-emitting diodes, sensors, capacitive sensors, touch sensors, photo-sensors, electromagnetic radiation sensors, or piezo-electric sensors. As used herein, a transducer is a device that converts energy in one form to energy of another form, for example electromagnetic radiation to electrical energy or vice versa. The devices 12 can be chiplets that are micro-transfer printed onto the system substrate 18 or larger modules that are disposed on the system substrate 18. The electrically conductive row lines 30, column lines 20, or line segments 32 can be wires, conductive traces, cured conductive ink, or other electrical conductors suitable for pattern-wise conducting electricity on a substrate and can be made of copper, silver, gold, aluminum, titanium, tantalum, conductive metal, transparent conductive oxides (TCOs) such as indium tin oxide, or any other conductive material. The conductive row lines 30, line segments 32, or column lines 20 can be patterned and interconnected or electrically isolated over the system substrate 18 using photolithographic or printed circuit board techniques.

The devices 12 are matrix addressed through the row and column lines 30, 20 by supplying signals on the row and column lines 30, 20. Additional power and ground lines or other control signals can be provided to the devices 12 (not shown in FIG. 1). The column lines 20 can be controlled by a column controller 92 through a bus 17 and the row lines 30 can be controlled by a row controller 94 through another bus 17. The buses 17 can be electrical buses, for example, arrays of wires provided in a flexible, flat cable. The row and column controllers 94, 92 can, in turn, be controlled by a system controller 96. In an embodiment, the repairable matrix-addressed system 10 is a display system, the system controller 96 is a display controller, and the devices 12 include light-output devices such as light-emitting diodes or micro-light-emitting diodes. In another embodiment, the repairable matrix-addressed system 10 is a sensor system, the system controller 96 is a sensor controller, and the devices 12 include sensors, such as light, electrical field, magnetic field, pressure, or heat sensors. In an embodiment, the repairable matrix-addressed system 10 is a touch-sensor system.

In operation, the row controller 94 and the column controller 92 matrix address the devices 12. The row controller 94 selects a row by providing a row select signal (for example a voltage or a digital signal such as a digital HIGH value or a one) on the row line 30 corresponding to the row of devices 12 that are addressed. The column controller 92 provides data on the column lines 20 and the data is combined with the row select signal (for example using a digital AND gate or a voltage differential between the row and column lines 30, 20) to enter data into the device 12 or cause the device 12 to operate. Thus, one row of devices 12 is addressed at one time. After one row of devices 12 are addressed, another row can be addressed in the same way, for example a neighboring row, until all of the rows have been addressed. The data provided on the column lines 20 can be provided by the system control 96 through the column controller 92, for example, by shifting data values along a serial shift register until the data is aligned with the column of devices 12 for which the data is intended for the selected row. The system, row, and column controllers 96, 94, 92 can be digital integrated circuits with appropriate driver circuits, such as transistors, for providing electrical signals on the row and column lines 30, 20.

As intended herein, a line segment 32 adjacent to a row line 30 is a line segment 32 that is closer to the row line 30 than any other row line 30. A first device 12 is adjacent to a second device 12 if no other device 12 is closer to a side of the first device than the second device 12. A first device 12 can be adjacent to two second devices 12, one second devices 12 on each side of the first device 12. As will be understood by those knowledgeable in the art, the terms "row" and "column" are arbitrary appellations that can be exchanged without affecting the functionality or structure of the present invention. Hence, the terms row and column can be interchanged without affecting the structure or operation of the present invention and are included in the present invention.

Figure 2:
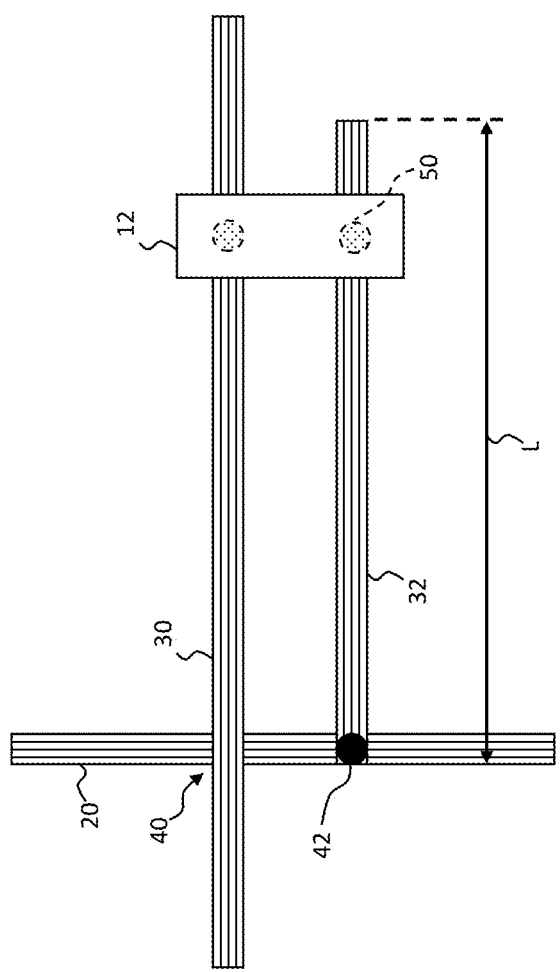
FIG. 2 is a schematic illustration according to an embodiment of the present invention.
Figure 3:
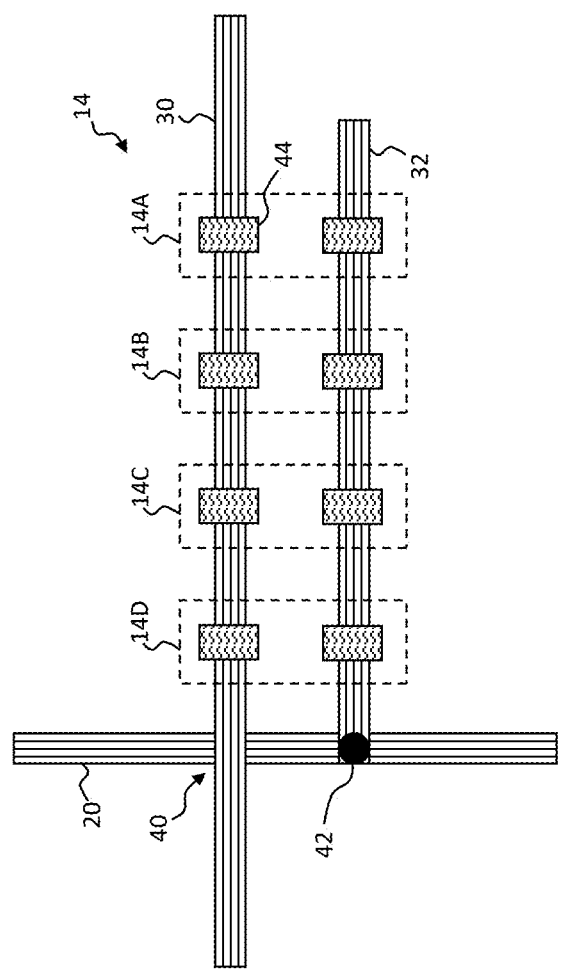
FIG. 3 is a schematic illustration according to an embodiment of the present invention having multiple device locations.

Referring to FIG. 2, according to an embodiment of the present invention, one or more of the line segments 32 extends substantially to one side of the column line 20 to which it is electrically connected, for example with an electrical connection 42 such as a filled electrical via. The device 12 can include connection posts 50 or device contact pads for electrically connecting to the row line 30 and line segment 32. As shown in FIG. 3, the line segment 32 can extend from the column line 20 far enough to provide device locations 14 for multiple devices, e.g., device locations 14A, 14B, 14C, and 14D, at which devices 12 can be located to electrically connect to the row line 30 and to the line segment 32, and thence to the column line 20. Thus, two or more devices 12 can be provided on only one side of the column line 20 to which the line segment 32 is electrically connected. As is also shown in FIG. 3, embodiments of the present invention can include contact pads 44 on the system substrate 18 that electrically connect to the row line 30 or line segment 32. The contact pads 44 can include softer material or have a greater width dimension than the row lines 30 or line segments 32, thus facilitating electrical connections between the devices 12 and the row lines 30 and line segments 32 and can be made using photolithographic or printed circuit board techniques.

Figure 4:
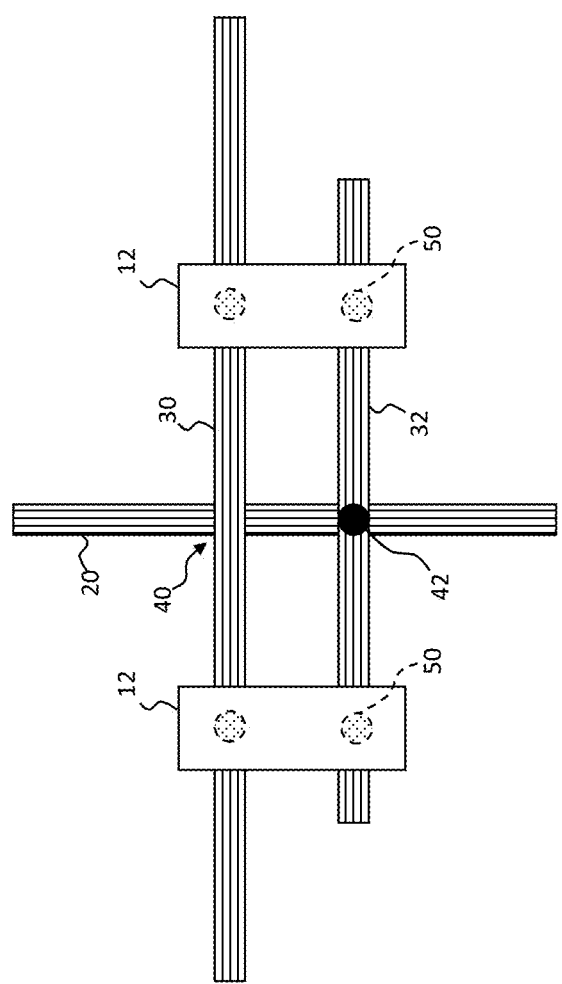
FIG. 4 is a schematic illustration according to an alternative embodiment of the present invention.
Figure 5:
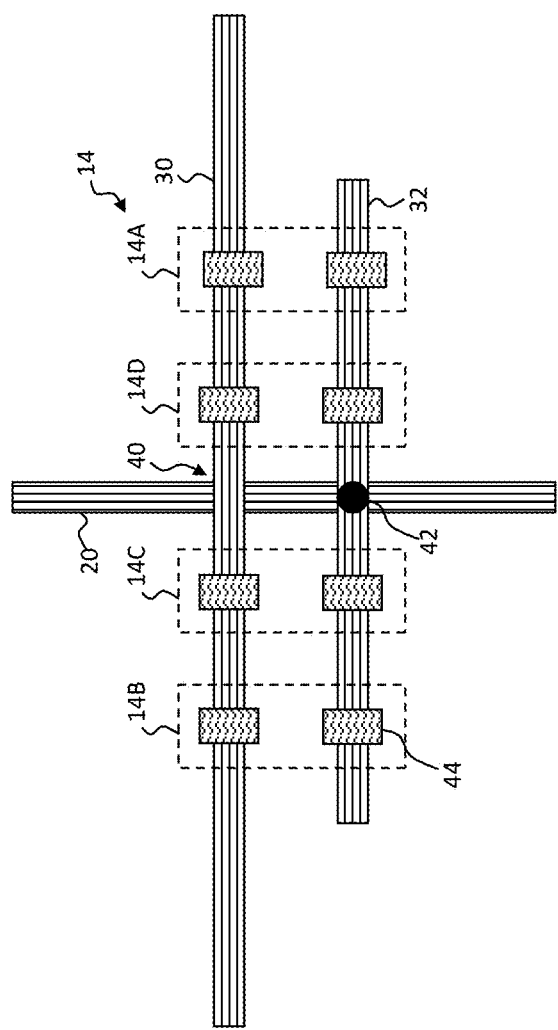
FIG. 5 is a schematic illustration according to an alternative embodiment of the present invention having multiple device locations.

Referring to FIG. 4, according to another embodiment of the present invention, one or more of the line segments 32 extends substantially to both sides of the column line 20 to which it is electrically connected, for example with an electrical connection 42 such as a filled electrical via. Devices 12 can electrically connect to the row line 30 and line segment 32 on each side of the column line 20, providing a second and redundant device 12 connected electrically in parallel with the device 12. As shown in FIG. 5, the line segment 32 can extend from the column line 20 far enough on each side of the column line 20 to provide device locations 14 on each side of the column line 20 for multiple devices 12, e.g., device locations 14A, 14B, 14C, and 14D, at which devices 12 can be located to electrically connect to the row line 30 and, through the line segment 32, to the column line 20. Thus, one or more devices 12 are provided on each side of the column line 20 to which the line segment 32 is electrically connected. This arrangement has the advantage of providing a more spatially uniform arrangement of devices 12 in the array since the devices 12 can be, on average, closer to the intersections 40.

In the case of either FIG. 2 or FIG. 4, one or more devices 12 are electrically connected to the column line 20 and to the row line 30, thereby providing matrix-addressed row and column connections to the repairable matrix-addressed system 10 of the present invention.

Figure 6:
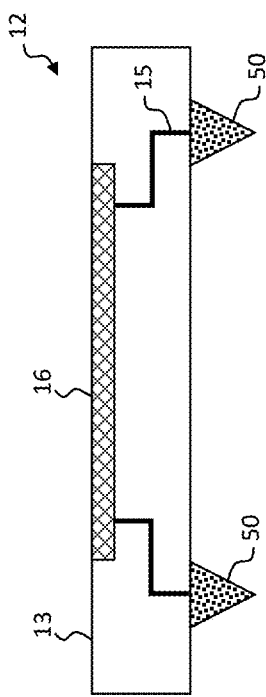
FIG. 6 is a cross section illustrating a device according to an embodiment of the present invention.
Figure 7:
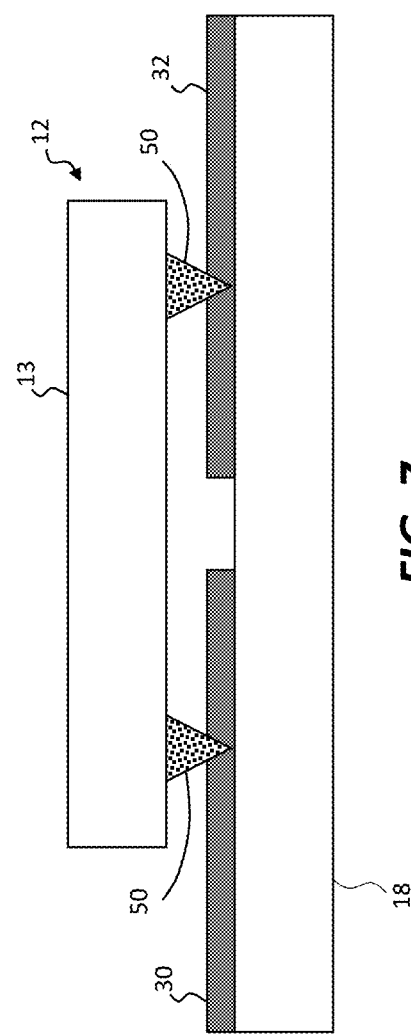
FIGS. 7 and 8 are cross sections illustrating a device and a substrate according to an embodiment of the present invention.
Figure 8:
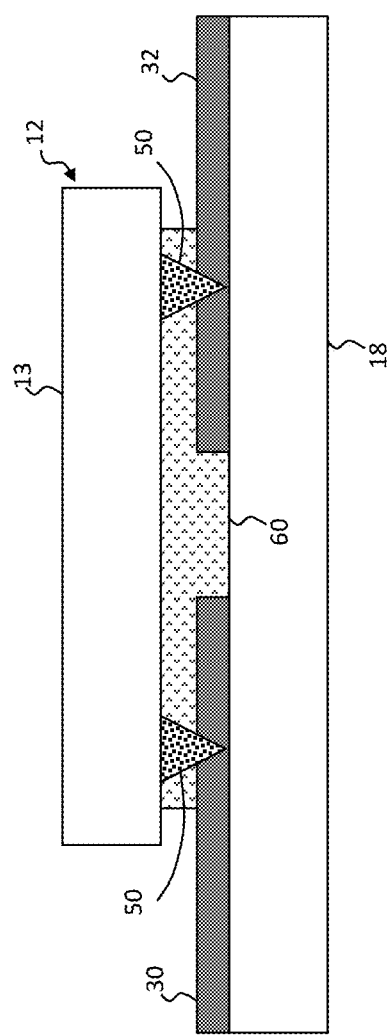

Referring to FIG. 6, in an embodiment of the present invention, the device 12 includes a device substrate 13 on or in which a circuit 16 is formed. For example, the device substrate 13 can be a semiconductor substrate and the circuit 16 is formed using photolithographic integrated circuit processes. The circuit 16 can be electrically connected, for example, through wires 15 to first and second electrically conductive connection posts 50. The first connection post 50 can form the electrical connection between the circuit 16 in the device 12 and the row line 30 and the second post can form the electrical connection between the device 12 and the line segment 32. As shown in FIG. 7, each connection post 50 is mechanically forced onto, into, or through a conductor, such as the line segment 32 or the row line 30, to provide an electrical connection between the circuit 16 and the line segment 32 or the row line 30. The connection posts 50 can be in contact with the line segment 32 or the row line 30, can be soldered to the line segment 32 or the row line 30, can pierce the line segment 32 or the row line 30, or can extend through the line segment 32 or the row line 30 to form the electrical connection. In an embodiment, the row line 30 and the line segment 32 are disposed on or in the surface of the system substrate 18 and the first and second connection posts 50 are soldered to the row line 30 and the line segment 32, respectively. Referring to FIG. 8, in another embodiment, the device 12 can be adhered with an adhesive 60 to any combination of the system substrate 18, the row line 30, or the line segment 32. The adhesive 60 can be a curable adhesive 60 and can be cured after the device 12 is disposed on the system substrate 18 and electrically connected to the row line 30 and the line segment 32.

System substrates 18, such as printed circuit boards, typically use multiple levels of conductor in the substrate to provide complex wiring patterns and to avoid unwanted electrical connections. In one embodiment, the row lines 30 or the line segments 32 are located closer to a surface of the system substrate 18 than the column lines 20. The line segments 32 are located in the same layer as the row lines 30, are equally exposed even if another layer, such as an adhesive layer, is located over the same layer, and are connected to the column lines 20 through the electrical connection 42, such as with a filled via. Thus, connection posts 50 can be applied to both the line segments 32 and the row lines 30 at the same time in a common step to electrically connect the device 12 to the row lines 30 and the column lines 20.

Figure 9:
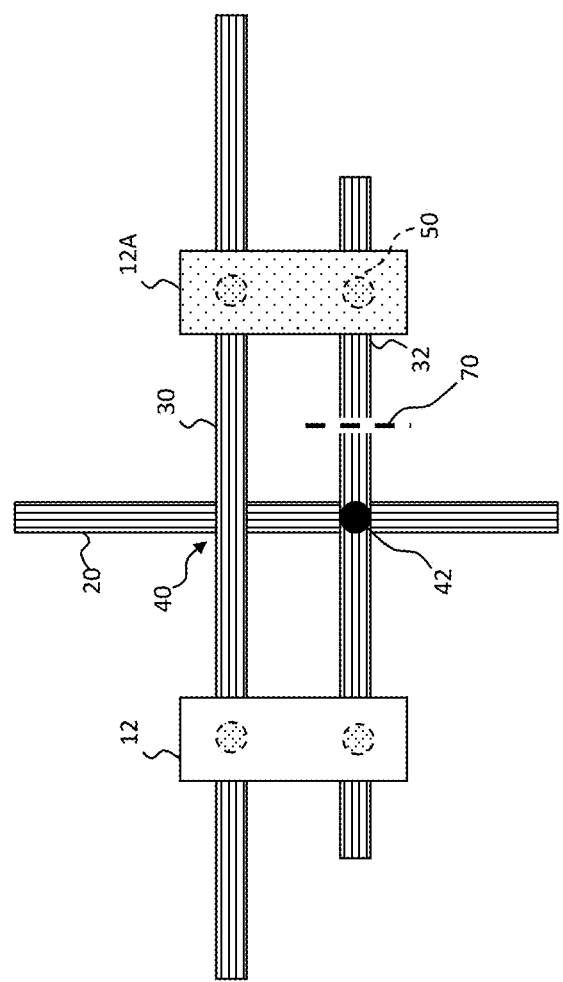
FIGS. 9 and 10 are schematic illustrations according to embodiments of the present invention having a cut line segment.

In embodiments of the present invention and as shown in FIG. 9, devices 12 can be defective devices 12A, for example having failed circuitry or failed electrical connections to the line segment 32 or row line 30. In this context, a failure can include, for example: (i) a shorted device 12 or one that is overly conductive; (ii) a non-conductive device 12 or forming an electrical open; (iii) a non-reactive or non-functional device 12; (iv) an absent device 12 such as one that failed to print or adhere adequately to the substrate or is printed to the wrong location; (v) a device 12 with unintended output, for example the wrong brightness, light output distribution, or color; or (vi) a device 12 that functions only intermittently. Referring to FIG. 9, the line segment 32 can be cut, for example with a laser beam to electrically isolate a defective device 12A from the column line 20. If another device 12 is present or is added after the defective device 12A is electrically isolated, the other device 12 can provide the function intended for the defective device 12A. As shown in FIG. 9, two devices 12 are electrically connected between one of the line segments 32 and one of the row lines 30. One of the devices 12 can be a defective device 12A. A cut 70 in the line segment 32 is located between the functional device 12 and the defective device 12A and between the defective device 12A and the column line 20. The cut 70 forms an electrical open circuit that electrically disconnects the defective device 12A from the column line 20.

Figure 10:
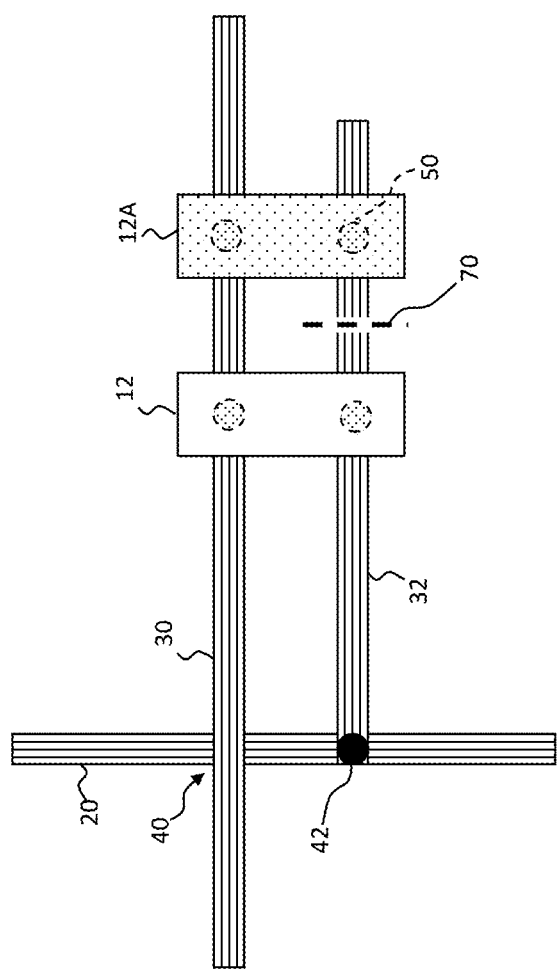
Figure 11:
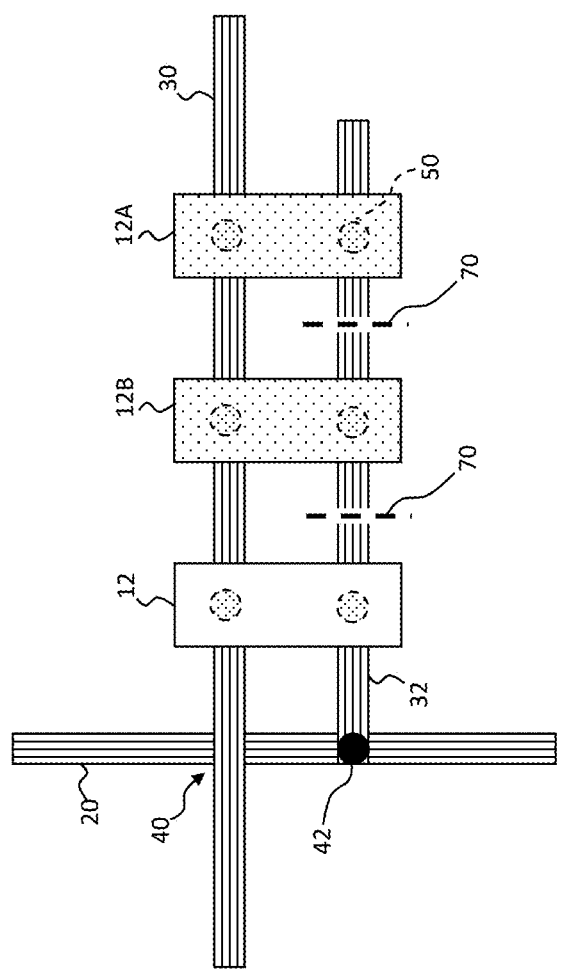
FIG. 11 is a schematic illustration according to a further embodiment of the present invention having cut line segments.

As shown in FIG. 9, the defective device 12A is on a side of the column line 20 opposite the functional device 12 (corresponding to the structure of FIG. 4). Alternatively, as shown in FIG. 10 and corresponding to FIGS. 3 and 4, multiple devices 12 are disposed between the row line 30 and the line segment 32 on a common side of the column line 20. In this case, the device 12 farthest from the column line 20 is the defective device 12A. The line segment 32 has a cut 70 between the defective device 12A and the functional device 12 and between the defective device 12A and the column line 20, electrically isolating the defective device 12A from both the column line 20 and the functional device 12. Referring to FIG. 11, multiple defective devices 12A, 12B can be accommodated by locating the defective devices 12A, 12B farther from the column line 20 than the functional devices 12. Thus, in this embodiment, three devices 12 are electrically connected between one of the line segments 32 and one of the row lines 30. Two cuts 70 are formed in the line segment 32 between adjacent pairs of the devices 12 that electrically disconnects two of the devices 12 from the column line 20. The electrically disconnected devices 12 can be defective devices 12.

Figure 16:
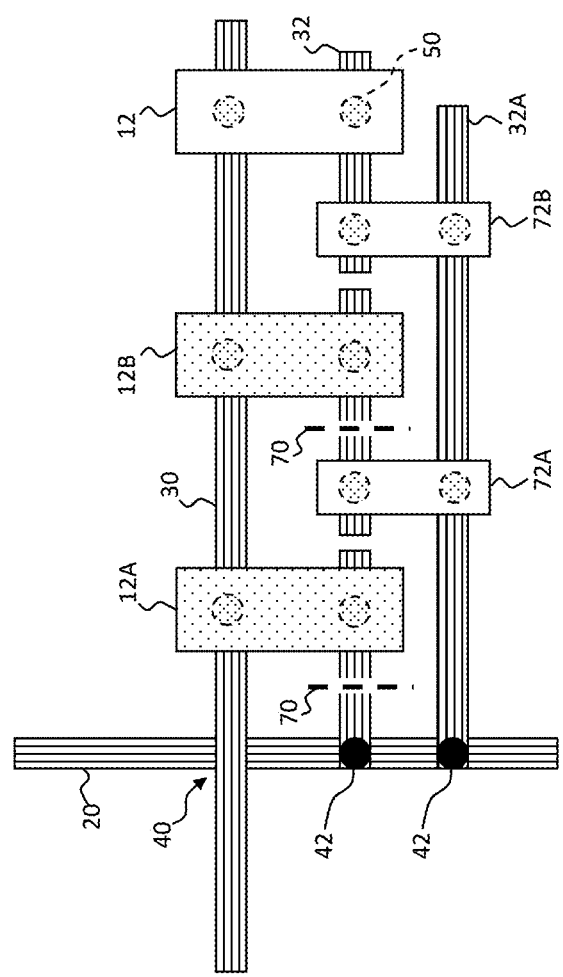
FIG. 16 is a schematic illustration according to another embodiment of the present invention having cut line segments.

An alternative approach is illustrated in FIG. 16. In this design, all of the devices 12 can be micro-transfer printed in a common step or in multiple steps before testing. In the example of FIG. 16, three devices 12 in all are printed (12, 12A, 12B, collectively 12) and two are redundant (12A, 12B). The first and second devices 12 are found to be defective after test. Each of the devices 12 has a separate line segment 32. Alternatively, a single line segment 32 can be cut in multiple places to ensure that only one device 12 is electrically connected. The first defective device 12A is electrically connected by the row and column lines 30, 32. However, as illustrated in FIG. 16, the defective device 12A is defective and includes an electrical short so a cut 70 removes it from the circuit. An electrical connector 72A is micro-transfer printed to electrically connect the column line 20 through a second line segment 32A to the defective device 12B. Again, after testing, the defective device 12B is determined to be defective and includes an electrical short so another cut 70 removes it from the circuit. Another electrical connector 72B is micro-transfer printed to electrically connect the column line 20 through the line segment 32A to the device 12. The device 12 is functional and remains in the circuit. If a device 12 does not need to be electrically connected because another device 12 is functional, one or more of the redundant devices (e.g. 12B) is not connected by an electrical connector (e.g., 72A) and is therefore isolated from the circuit and not operational. Other physical arrangements of line segments 32, 32A are possible and electrically equivalent arrangements are included in the present invention. Electrical connectors 72A and 72B are micro-transfer printable electrical jumpers that provide an electrical connection between conductors. Such electrical connections and methods for using them are described in U.S. patent application Ser. No. 14/821,046, U.S. patent application Ser. No. 14/822,864, and U.S. patent application Ser. No. 14/823,917, the contents of all of which are included herein in their entirety.

Figure 13:
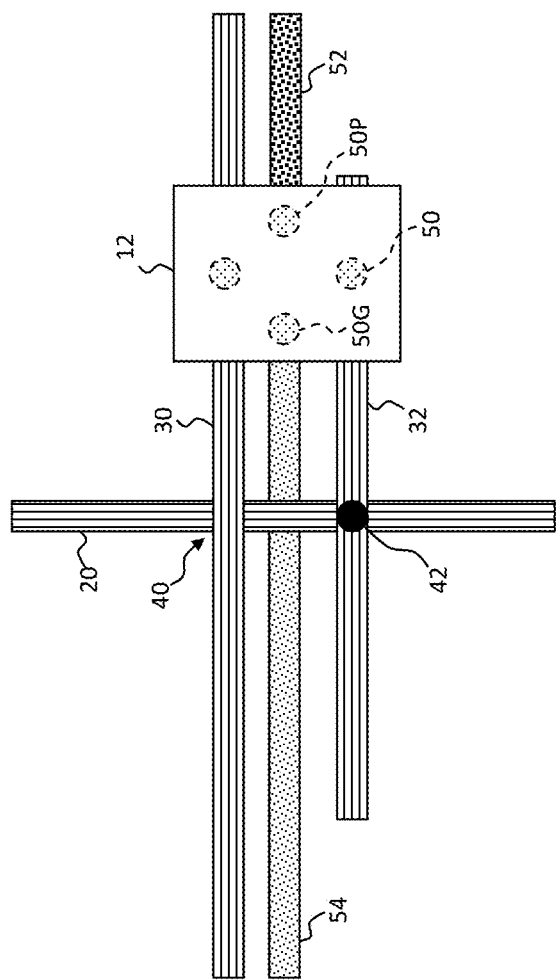
FIG. 13 is a schematic illustrating the device of FIG. 12 and a system substrate according to an embodiment of the present invention.
Figure 12:
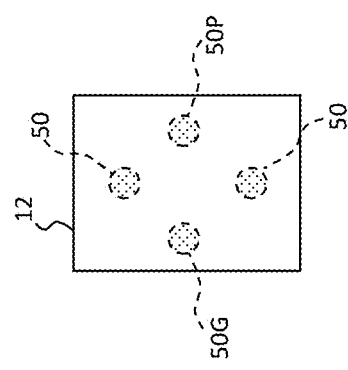
FIG. 12 is a schematic illustrating a device according to an embodiment of the present invention having additional connections.

Although FIGS. 1-11, and 16 illustrate devices 12 with two electrical connections, such as connection posts 50, the devices 12 can have more electrical connections and connection posts 50. For example, the device 12 illustrated in FIG. 12 includes four electrical connections and connection posts 50. Two of the connection posts 50 can be used to communicate information signals. Another of the connection posts 50 is a power connection post 50P used to provide power to the device 12, and the fourth connection post 50 is a ground connection post 50G used to provide a ground signal. Similarly, as shown in FIG. 13, a device 12 according to an embodiment of the present invention has one connection post 50 electrically connected to the row line 30, one connection post 50 electrically connected to the line segment 32, one connection post 50 electrically connected to a power line 52 provided on the system substrate 18, and one connection post 50 electrically connected to a ground line 54 provided on the system substrate 18.

Figure 14:
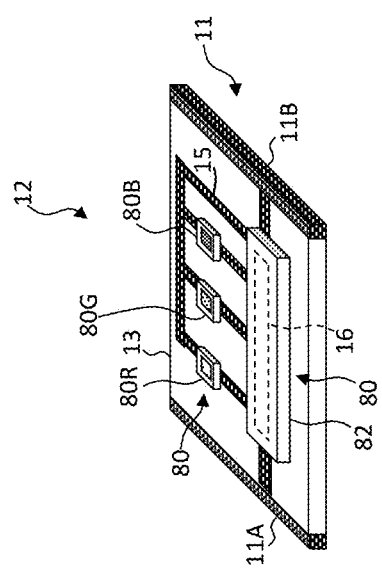
FIG. 14 is a perspective illustrating a module having elements according to an embodiment of the present invention.

According to embodiments of the present invention, the device 12 is a chiplet, for example, a small integrated circuit such as a bare unpackaged die micro-transfer printed onto the system substrate 18. For example, in an embodiment the device 12 is a micro-light-emitting diode that is micro-transfer printed onto the system substrate 18. In another embodiment and as illustrated in FIG. 14, the device 12 has a device substrate 13 providing a module that includes one or more electrically or optically connected elements 80, for example, electrically connected with wires 15, each element 80 having an element substrate 82 separate and distinct from the device substrate 13 and the system substrate 18. The elements can include one or more bare die, integrated circuits, unpackaged integrated circuits, electronic circuits, optical circuits, transducers, light emitters, light-emitting diodes, micro-light-emitting diodes, sensors, capacitive sensors, touch sensors, photo-sensors, electromagnetic radiation sensors, or piezo-electric sensors. For example, and as illustrated, the device 12 module includes a chiplet element 80 with a circuit 16 formed in or on a chiplet element substrate 82 disposed, for example, by micro-transfer printing onto the device substrate 13 as are other elements 80, for example a red light emitter 80R, a green light emitter 80G, and a blue light-emitter 80B. Alternatively, the devices 12 can be ultra-violet or infrared light emitters. The devices 12 can be light-emitting diodes. In a further embodiment, the device 12 module includes redundant light emitters, for example, a second red light emitter 80R, a second green light emitter 80G, and a second blue light-emitter 80B, for a total of six light emitters in the device 12 module. Alternatively, the device 12 module includes additional light emitters emitting light of different colors, for example, a cyan light emitter or a yellow light emitter, to expand the color gamut available from the device 12 module. In yet another embodiment, the device 12 module includes additional light emitters emitting slightly different colors of light to enable color correction (e.g., emitting a slightly different color of red, a slightly different color of green, and a slightly different color of blue). The light-emitter elements 80 can be micro-light-emitting diodes provided on the device substrate 13, for example by micro-transfer printing, and electrically connected to the circuit 16, for example with photolithographically formed wires 15 providing electrical connections. Other electrically connecting wires 15 can be connected to the circuit 16 or light emitters 80R, 80G, 80B and can include terminals 11A, 11B. The terminals 11A, 11B can be electrical connections for the module and provide electrical connections to the system substrate 18 on which the module can be disposed, for example, by micro-transfer printing or pick-and-place techniques. The module device 12 can be a surface-mount device and can be electrically connected to electrical conductors on the system substrate 18, such as the row lines 30 and line segments 32, by soldering or other electrical connection techniques to provide a matrix-addresses system according to embodiments of the present invention. The module device substrate 13 can be a semiconductor substrate and can include module circuits 16 formed on or in the semiconductor substrate in addition to, or in place of the element 80 circuit 16 illustrated in FIG. 14. The module circuit 16 can electrically or optically connect to one or more of the elements 80 or the terminals 11A, 11B. The module device 12 can have more than two terminals 11, for example four terminals 11, as described with respect to the device 12 of FIG. 12.

In an embodiment, the repairable matrix-addressed system 10 of the present invention is a passive-matrix system in which the row and column controllers 94, 92 provide current or voltage to rows of devices 12 at a time to enable the devices 12, for example to emit light. Alternatively, the column controller 92 can receive current or voltage from the devices 12, for example when the devices 12 are sensors. In such passive-matrix embodiments, the devices 12 are only active when they are selected by a signal provided on the row line 30.

In another embodiment, the repairable matrix-addressed system 10 of the present invention is an active-matrix system in which the row and column controllers 94, 92 provide current or voltage to rows of devices 12 at a time to enable the devices 12 to store information or to provide information. Once the information is stored, the device 12 can provide a function related to the information, for example to emit light. Alternatively, the column controller 92 can receive current or voltage from the device 12, a row at a time, for example when the devices 12 are sensors. In such active-matrix embodiments, the devices 12 can be active even when they are not selected by a signal provided on the row line 30.

In an embodiment of the present invention, a repairable matrix-addressed system 10 includes a system substrate 18, an array of electrically conductive row lines 30 disposed over the system substrate 18, the row lines 30 extending over the system substrate 18 in a row direction. An array of electrically conductive column lines 20 is disposed over the system substrate 18, the column lines 20 extending over the system substrate 18 in a column direction different from the row direction, thereby defining an array of non-electrically conductive intersections 40 between the row lines 30 and the column lines 20. An array of electrically conductive line segments 32 is disposed over the system substrate 18, each line segment 32 in association with an intersection 40. The line segments 32 extend over the system substrate 18 substantially parallel to the row direction. The line segments 32 have a line segment length L that is less than the distance D between adjacent columns, and each line segment 32 is electrically connected to a column line 20. The line segment 32 extends for a distance over the system substrate 18 to provide one or more device locations 14 between each pair of adjacent row lines 30 and line segments 32.

As used herein, a line segment 32 is substantially parallel to the row line 30 if an electrical connection of a device 12 can be electrically connected to the line segment 32 and another electrical connection of the device 12 can be electrically connected to the row line 30 anywhere along the length of the line segment 32 or at any device location 14 on the line segment 32. None of the line segments 32, row lines 30, or column lines 20 need be straight lines. The appellation 'line' is used herein to refer to a relatively long and extended conductor such as a conductive trace or wire. A line or line segment is used to transfer signals such as electrical signals from one portion of the line or line segment to another, different portion of the line or line segment.

Figure 15:
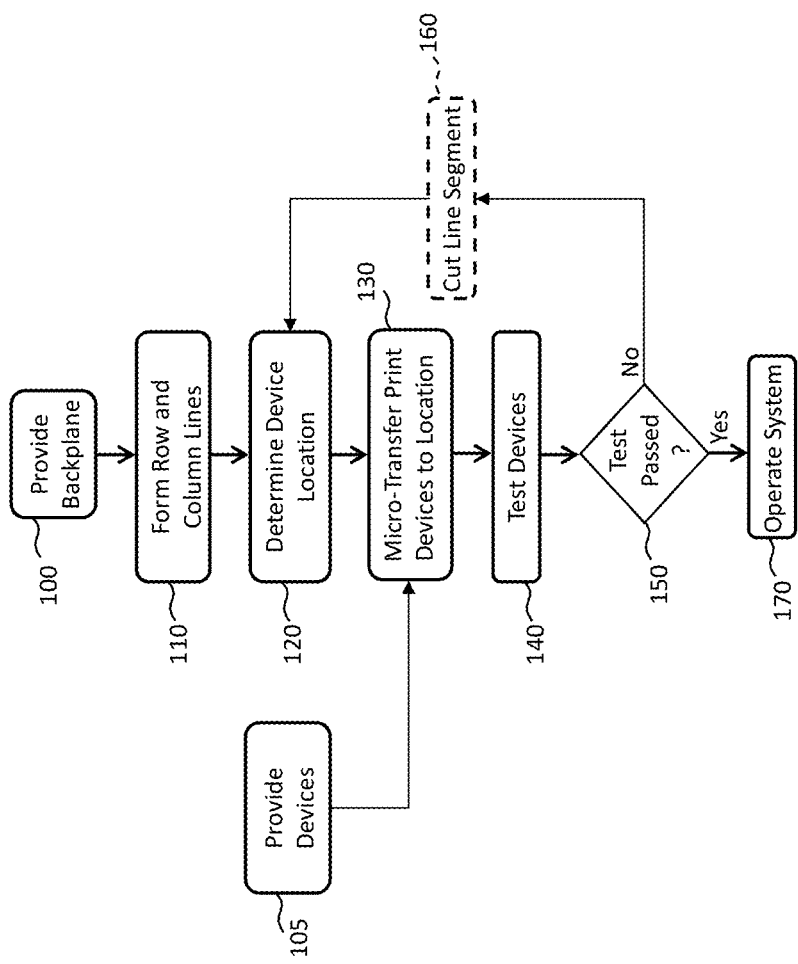
FIG. 15 is a flow chart illustrating a method of the present invention.

Referring to FIG. 15, a method of making a repairable matrix-addressed system 10 according to an embodiment of the present invention includes providing a system substrate 18 in step 100. In step 110, the system substrate 18 is provided with i) an array of electrically conductive row lines 30 disposed over the system substrate 18, the row lines 30 extending over the system substrate 18 in a row direction; ii) an array of electrically conductive column lines 20 disposed over the system substrate 18, the column lines 20 extending over the system substrate 18 in a column direction different from the row direction, thereby defining an array of non-electrically conductive intersections 40 between the row lines 30 and the column lines 20; and iii) an array of electrically conductive line segments 32 disposed over the system substrate 18, the line segments 32 extending over the system substrate 18 substantially parallel to the row direction, the line segments 32 having a line segment length L that is less than the distance D between adjacent columns, and each line segment 32 is electrically connected to a column line 20.

In step 120, device locations 14 are determined. This determination can be an inherent part of the row and column line 30, 20 formation or layout design. Devices 12 are provided in step 105 and then disposed, for example by micro-transfer printing to the device locations 14 on the system substrate 18 in step 130 so that one or more devices 12 are electrically connected to each row line 30 and to each line segment 32. The devices 12 are tested in place on the system substrate 18 in step 140 and the test evaluated in step 150. If the tests are all successful and none of the devices 12 are failed defective devices 12A, then the repairable matrix-addressed system 10 can be operated in step 170.

If, on the other hand, one or more of the devices 12 fails and defective devices 12A are present on the system substrate 18, the line segments 32 associated with the defective devices 12A are optionally cut in step 160 to electrically isolate the defective device 12A from the column line 20, as shown in FIGS. 9 and 10. A new device location 14 is determined in step 120 and the process repeated (e.g., as shown in FIG. 11) by adding additional device 12 in the determined device locations 14 until a functioning device 12 is electrically connected between each of the line segments 32 and corresponding row line 30.

To facilitate the disposition of the devices 12 in device locations 14 that enable repair, the devices 12 can be first disposed at the ends of the line segments 32 farthest from the column line 20 so that each successive device 12 can be electrically isolated from the column line 20 by cutting the line segment 32 if the device 12 is a defective device 12A. For example, in FIGS. 3 and 5, the device locations 14A-14D are labeled in alphabetic order corresponding to the order of the device locations 14 in which the devices 12 can be disposed. As shown in FIG. 3, the device location 14A is furthest from the column line 20 and the device location 14D is the closest, indicating that the device locations 14 should be used in the order 14A, 14B, 14C, and 14D. If none of the four devices 12 in any of the four device locations 14A-14D is functional, the matrix addressed system 10 is failed and further rework can be necessary, for example, removing defective devices 12A from the system substrate 18.

In an embodiment of the present invention, the devices 12 are disposed using micro-transfer printing. The devices 12 can include first and second electrically conductive connection posts 50 that protrude from the device substrate 13 (as shown in FIG. 6) and the step of micro-transfer printing forms the electrical connection between the first connection post 50 and the row line 30 and forms the electrical connection between the second connection post 50 and the line segment 32 (and thence to the column line 20). In a further embodiment of the present invention, the first connection post 50 is soldered to the row line 30 and the second connection post 50 is soldered to the line segment 32. In yet another embodiment, an adhesive 60 (for example a resin or epoxy) is provided between the devices 12 and the system substrate 18 to adhere the devices 12 to the system substrate 18. In a further embodiment, the adhesive 60 includes cross-linking materials and is cured to adhere the devices 12 to the system substrate 18, for example with heat or radiation.

The system substrate 18 can be provided in step 100 using printed circuit board (PCB) or display technology techniques. The devices 12 can be provided using integrated circuit technologies, for example, including photolithography. Device locations 14 can be inherently determined by a layout designer of the system who lays out the line segments 32 on the system substrate 18 or by an image processing algorithm operating on a computer that controls the disposition of devices 12 on the system substrate 18 using size information for the devices 12 and line segments 32, as well as process flow for tracking sequentially disposed devices 12. The device locations 14 can be indicated by the contact pads 44. Devices 12 can be tested using electrical stimulation (e.g., matrix-addressed control methods suited to the devices 12) and an optical measurement of the output of the devices 12 (e.g., using a digital camera if the devices 12 provide optical output such as light emission) or other output measurement method. Once the device output is measured, defective devices 12A are determined and further repair steps undertaken (e.g., cutting line segments 32 in step 160 and repeated device location 14 determination in step 120, device 12 disposition in step 130, and device 12 testing in step 140.) If the devices 12 are sensors, the input from the sensors on the column lines 12 can indicate which devices 12 are defective devices 12A by exposing the sensors to suitable environmental stimulation.

The devices 12 can be active components, for example, including one or more active elements 80 such as electronic transistors or diodes or light-emitting diodes and photodiodes that produce an electrical current in response to ambient light. Alternatively, the device 12 can be a passive component, for example, including one or more passive elements 80 such as resistors, capacitors, or conductors. In another embodiment, the device 12 is a compound device 12 that includes both active and passive elements 80. The device 12 can be a semiconductor device having one or more semiconductor layers, patterned metal layers, and patterned dielectric layers, such as an integrated circuit. The device 12 can be an unpackaged bare die. In yet another embodiment, the device 12 is a compound module having a plurality of active or passive elements 80, such as multiple semiconductor devices with separate substrates, each with one or more active elements 80 or passive elements 80, or both. In certain embodiments, the plurality of elements 80 is disposed and interconnected on a compound module device substrate 13 separate from the substrates of any semiconductor devices or the system substrate 18. The compound device 12 can be micro transfer printed itself after the elements 80 have been arranged and interconnected thereon or can be disposed using pick-and-place technologies. The devices 12 or elements 80 can be electronic processors, controllers, drivers, light-emitting diodes, photodiodes, light-control devices, or light-management devices.

The devices 12 can include active electronic circuits 16 formed using lithographic processes and can include passive circuits such as resistors and electrical connections, e.g., wires, to device contact pads and connection posts 50. In certain embodiments, the device contact pads are planar electrical connections formed on a process side of the device 12 and source wafer. Such device contact pads are typically formed from metals such as aluminum or polysilicon using masking and deposition processes used in the art. In another embodiment, the device contact pads are directly electrically connected to the circuit 16 without intervening wires 15. In some embodiments, device contact pads and the circuit 16, together with other functional structures formed in the active layer on the source wafer make up the device 12, chiplet, or module. In certain embodiments, the device contact pads are electrically connected to the circuit 16 with wires 15 and to the row lines 30 and line segments 32, for example using photolithographic processes.

In some embodiments, the device contact pads are omitted and the connection posts 50 are electrically connected to the circuit 16 with the wires 15 (as shown in FIG. 6). In other embodiments, each contact pad and its respective connection post 50 are a single component (e.g., formed together as a contact terminal).

In some embodiments of the present invention, the devices 12 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet devices 12 can be made in a source semiconductor wafer (e.g., a silicon or GaN wafer) having a process side and a back side used to handle and transport the wafer. Devices 12 are formed using lithographic processes in an active layer on or in the process side of the source wafer. An empty release layer space is formed beneath the devices 12 with tethers connecting the devices 12 to the source wafer in such a way that pressure applied against the devices 12 breaks the tethers to release the devices 12 from the source wafer, for example, with a micro-transfer printing stamp. Methods of forming such structures are described, for example, in U.S. Pat. No. 8,889,485 whose contents are incorporated by reference herein in their entirety. Lithographic processes for forming devices 12 in a source wafer, for example transistors, wires, and capacitors, can be found in the integrated circuit art.

According to various embodiments of the present invention, the native source wafer can be provided with the devices 12, release layer, tethers, and connection posts 50 already formed, or they can be constructed as part of the process of the present invention.

In certain embodiments, the electrically conducting wires 15 include patterned metal layers forming device contact pads. The device contact pads can be made using integrated circuit photolithographic methods.

Referring to the cross section of FIG. 6, in an embodiment of the present invention, a device 12 includes a plurality of electrically conducting wires 15 in or on a device substrate 13 and protruding electrically conductive connection posts 50. Devices 12 with connection posts 50 are described in U.S. patent application Ser. No. 14/743,788 entitled Micro Assembled LED Displays and Lighting Elements by Bower et al. and in U.S. patent application Ser. No. 14/822,864 entitled Chiplets with Connection Posts by Prevatte et al. whose contents are incorporated herein by reference in their entirety.

Connection posts 50 are electrical connections formed on the process side of the device 12 that extend generally perpendicular to the surface of the process side. Such connection posts 50 can be formed from metals such as aluminum, titanium, tungsten, copper, silver, gold, or other conductive metals. The connection posts 50 can be formed by repeated masking and deposition processes that build up three-dimensional structures or by etching one or more layers of metal evaporated or sputtered on the process side of the device 12. Such structures can also be made by forming a layer above the device 12 surface, etching a well into the surface, filling it with a conductive material such as metal, and then removing the layer. In some embodiments, the connection posts 50 are made of one or more high elastic modulus metals, such as tungsten. As used herein, a high elastic modulus is an elastic modulus sufficient to maintain the function and structure of the connection post 50 when pressed into a backplane contact pads 44 as shown in FIG. 3. In some embodiments, the connection posts 50 are electrically connected to the circuit 16 and the connection posts 50 and the circuit 16, together with other functional active or passive structures formed in the active layer on the source wafer, make up the device 12.

The connection posts 50 can have a variety of aspect ratios and typically have a peak area smaller than a base area. The connection posts 50 can have a sharp point for embedding in or piercing row lines 30 or line segments 32. Devices 12 with protruding connection posts 50 generally are discussed in U.S. Pat. No. 8,889,485.

In another embodiment, two or more connection posts 50 are electrically shorted in a device 12 and electrically connected to a common contact pad 44, to further reduce the likelihood of a faulty electrical connection between the device 12 and the row line 30 or line segment 32. Such redundant electrical connections reduce contact failures between the connection posts 50 and the contact pads 44.

Contact pads 44 can be provided in the display locations 14 on the system substrate 18 and electrically connected to the row lines 30 or line segments 32, or both (FIG. 3) and can be made of a relatively soft metal, such as tin, solder, or tin-based solder, to assist in forming good electrical contact with the connection posts 50 and adhesion with the devices 12. As used herein, a soft metal may refer to a metal into which a connection post 50 can be pressed to form an electrical connection between the connection post 50 and the contact pad 44. In this arrangement, the contact pad 44 can plastically deform and flow under mechanical pressure to provide a good electrical connection between the connection post 50 and the contact pad 44.

In another embodiment of the present invention, the connection posts 50 can include a soft metal and the contact pads 44 include a high elastic modulus metal. In this arrangement, the connection posts 50 can plastically deform and flow under mechanical pressure to provide a good electrical connection between the connection post 50 and the contact pads 44.

If an optional adhesive 60 is provided on the system substrate 18 (the destination substrate), the connection posts 50 can be driven through the adhesive 60 to form an electrical connection with the contact pads 44 beneath the adhesive 60. The adhesive 60 can be cured to more firmly adhere the devices 12 to the destination substrate 20 and maintain a robust electrical connection between the connection posts 50 and backplane contact pads 22 in the presence of mechanical stress. The adhesive 60 can undergo some shrinkage during the curing process that can further strengthen the electrical connectivity and adhesion between the connection post 50 and the contact pads 44.

In an embodiment, the contact pads 44 include or are coated with a conductive material or solder. The connection posts 50 can contact, be embedded in, or pierce the conductive material. In some embodiments, the contact pad 44 has a first conductive layer and a second conductive layer over the first conductive layer, and the second conductive layer has a lower melting temperature than the first conductive layer. With a subsequent heat treatment, the solder can reflow and promote the electrical connection between the connection posts 50 and the contact pads 44. In yet another embodiment, both the connection posts 50 and the contact pads 44 include a layer of conductive material such as solder or have a layer of conductive material other than the material making up the connection posts 50 or contact pads 44 that electrically connects the contact pad 44 to the connection post 50. A heat treatment can also serve to weld the contact pad 44 to the connection post 50. Welding can be facilitated by providing a common material on the surfaces of the connection posts 50 and the contact pads 44.

In another embodiment, the contact pads 44 are coated with an optional polymer layer that can extend over the system substrate 18. The connection posts 50 of the printable devices 12 are driven through the polymer layer to make electrical contact with the contact pads 44. The polymer layer can protect the contact pads 44 and serve to embed the connection posts 50 in the contact pads 44 by adhering to the connection posts 50. Alternatively, a compliant polymer layer is formed beneath the contact pads 44 to facilitate the mechanical contact made when the connection posts 50 are embedded in the contact pads 44. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 50 to the contact pads 44.

Devices 12 can be small electronic integrated circuits, for example, having a size of about 5 microns to about 5000 microns in a dimension. The electronic circuits 16 can include semiconductor materials (for example inorganic materials such as silicon or gallium arsenide, or inorganic materials) having various structures, including crystalline, microcrystalline, polycrystalline, or amorphous structures.

In some embodiments, the devices 12 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the devices 12 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the system substrates 18. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the devices 12 can be formed in a microcrystalline, polycrystalline, or amorphous semiconductor layer.

The devices 12 can be constructed using foundry fabrication processes used in the art. Layers of materials can be used, including materials such as metals, oxides, nitrides and other materials used in the integrated-circuit art. Each device 12 can be a complete semiconductor integrated circuit and can include, for example, transistors. The devices 12 can have different sizes, for example, 1000 square microns or 10,000 square microns, 100,000 square microns, or 1 square mm, or larger, and can have variable aspect ratios, for example 1:1, 2:1, 5:1, or 10:1. The device 12 can be rectangular or can have other shapes.

Embodiments of the present invention provide advantages over other printing methods described in the prior art. By employing connection posts 50 on devices 12 and a printing method that provides devices 12 on a destination system substrate 18, a low-cost method for printing chiplets in large quantities over a destination system substrate 18 is provided. Furthermore, additional process steps for electrically connecting the devices 12 to the destination system substrate 18 are obviated.

The source wafer and devices 12 and destination system substrate 18 can be made separately and at different times or in different temporal orders or locations and provided in various process states.

The matrix-addressed systems 10 of the present invention can be constructed using display and thin-film manufacturing method independently of or in combination with micro-transfer printing methods, for example as are taught in U.S. patent application Ser. No. 14/743,981 entitled Micro Assembled LED Displays and Lighting Elements and in U.S. patent application Ser. No. 14/822,868 filed Sep. 25, 2014, entitled Compound Micro-Assembly Strategies and Devices, the contents of which are incorporated by reference herein in their entirety.

Devices 12 of the present invention can be used to form circuits useful in displays for example as described in U.S. patent application Ser. No. 14/835,282 entitled Bit-Plane Pulse Width Modulated Digital Display System by Cok et al. and in U.S. patent application Ser. No. 14/757,722 entitled Two-Terminal Store-and-Control Circuit by Cok et al., the contents of both of which are hereby incorporated in their entirety.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

D distance
L line segment length
10 repairable matrix-addressed system
11 terminals
11A terminal
11B terminal
12 device
12A defective device
12B defective device
13 device substrate
14 device location
14A device location
14B device location
14C device location
14D device location
15 wires
16 circuit
17 bus
18 system substrate
20 column line
30 row line
32 line segment
32A line segment
40 intersection
42 electrical connection
44 contact pads
50 electrical connection post
50P power connection post
50G ground connection post
52 power line
54 ground line
60 adhesive
70 cut/electrical open
72A electrical connector
72B electrical connector
80 element
82 element substrate
80R red light emitter
80G green light emitter
80B blue light emitter
92 row controller
94 column controller
96 system controller
100 provide backplane step
105 provide devices step
110 form row and column lines step
120 determine device locations step
130 micro-transfer print devices to location step
140 test devices step
150 decision step
160 optional cut line segment step
170 operate system step

The invention claimed is:
1. A repairable matrix-addressed system, comprising:
a system substrate;
an array of electrically conductive row lines disposed over the system substrate, the row lines extending over the system substrate in a row direction;
an array of electrically conductive column lines disposed over the system substrate, the column lines extending over the system substrate in a column direction different from the row direction defining an array of non-electrically conductive intersections between the row lines and the column lines;
an array of electrically conductive line segments disposed over the system substrate, the line segments extending over the system substrate substantially parallel to the row direction, the line segments having a line segment length that is less than the distance between adjacent column lines, and each line segment electrically connected to a column line; and one or more devices electrically connected to each row line and to each line segment adjacent to the row line, wherein:

only one device is electrically connected to a first row line and to a first line segment adjacent to the first row line;

at least two or more devices are electrically connected to a second row line and to a second line segment adjacent to the second row line; and the first row line is different from the second row line, the first line segment is different from the second line segment, or the first row line is different from the second row line and the first line segment is different from the second line segment.

2. The system of claim 1, wherein one or more of the line segments extends to both sides of the column line to which it is electrically connected.

3. The system of claim 1, wherein one or more devices are provided on each side of the column line to which the line segment is electrically connected.

4. The system of claim 1, wherein one or more of the line segments extends substantially to one side of the column line to which it is electrically connected.

5. The system of claim 1, wherein two or more devices are provided on only one side of the column line to which the line segment is electrically connected.

6. The system of claim 1, wherein two devices are electrically connected between one of the line segments and one of the row lines and comprising a cut in the line segment between two of the devices that electrically disconnects one of the devices from the column line.

7. The system of claim 6, wherein one of the two devices is defective.

8. The system of claim 6, wherein the device nearest the column line is defective and comprising an electrical connector electrically connecting the device farthest from the column line to the column line.

9. The system of claim 1, wherein three devices are electrically connected between one of the line segments and one of the row lines and comprising two cuts in the line segment between adjacent pairs of the devices that electrically disconnects two of the devices from the column line.

10. The system of claim 1, wherein the devices comprise a substrate and first and second electrically conductive connection posts protruding from the system substrate, the first posts forming the electrical connection between the device and the row line and the second post forming the electrical connection between the device and the line segment.

11. The system of claim 10, wherein the row line and the line segment are disposed on or in the surface of the system substrate and wherein the first or second connection posts extend onto, into, or through the row line or line segment, respectively.

12. The system of claim 10, wherein the row line and the line segment are disposed on or in the surface of the system substrate and wherein the first or second connection posts are soldered to the row line or the line segment, respectively.

13. The system of claim 10, comprising a non-conductive adhesive adhering the device to the system substrate, to the row line, or to the column line.

14. The system of claim 1, wherein the row lines and the line segments are in a common layer and are equally exposed or are covered with the same layers.

15. The system of claim 1, comprising contact pads on the system substrate electrically connected to the row lines or the line segments and the devices are electrically connected to the contact pads.

16. A repairable matrix-addressed system, comprising:

a system substrate;

an array of electrically conductive row lines disposed over the system substrate, the row lines extending over the system substrate in a row direction;

an array of electrically conductive column lines disposed over the system substrate, the column lines extending over the system substrate in a column direction different from the row direction defining an array of non-electrically conductive intersections between the row lines and the column lines; and an array of electrically conductive line segments disposed over the system substrate, the line segments extending over the system substrate substantially parallel to the row direction, the line segments having a line segment length that is less than the distance between adjacent columns, and each line segment electrically connected to a column line; wherein the line segment extends for a distance over the system substrate to provide one or more empty device locations for each pair of adjacent row lines and line segments.

17. A method of making a repairable matrix-addressed system, comprising:

providing a system substrate:

i) having an array of electrically conductive row lines disposed over the system substrate, the row lines extending over the system substrate in a row direction;

ii) having an array of electrically conductive column lines disposed over the system substrate, the column lines extending over the system substrate in a column direction different from the row direction defining an array of non-electrically conductive intersections between the row lines and the column lines; and iii) having an array of electrically conductive line segments disposed over the system substrate, the line segments extending over the system substrate substantially parallel to the row direction, the line segments having a line segment length that is less than the distance between adjacent columns, and each line segment electrically connected to a column line; and after providing the system substrate, disposing one or more devices on the system substrate so that the one or more devices are electrically connected to each row line and to each line segment.

18. The method of claim 17, comprising testing the devices to determine any failed device and adding an additional device between the line segment and row line corresponding to any failed device.

19. The method of claim 17, wherein the one or more devices includes at least one redundant device and comprising testing the devices to determine any failed device and adding an electrical connector to electrically connect the at least one redundant device to the row or column lines.

20. The method of claim 19, comprising cutting the line segment between the failed device and the column line, line segment, or row line to electrically isolate the failed device.

21. A repairable matrix-addressed system, comprising:

a system substrate;

an array of electrically conductive row lines disposed over the system substrate, the row lines extending over the system substrate in a row direction;

an array of electrically conductive column lines disposed over the system substrate, the column lines extending over the system substrate in a column direction different from the row direction defining an array of non-electrically conductive intersections between the row lines and the column lines;

an array of electrically conductive line segments disposed over the system substrate, the line segments extending over the system substrate substantially parallel to the row direction, the line segments having a line segment length that is less than the distance between adjacent column lines, and each line segment electrically connected to a column line;

one or more devices electrically connected to each row line and to each line segment adjacent to the row line;

wherein two devices are electrically connected between one of the line segments and one of the row lines and comprising a cut in the line segment between two of the devices that electrically disconnects one of the devices from the column line; and wherein the device nearest the column line is defective and comprising an electrical connector electrically connecting the device farthest from the column line to the column line.

22. A repairable matrix-addressed system, comprising:
a system substrate;
an array of electrically conductive row lines disposed over the system substrate, the row lines extending over the system substrate in a row direction;
an array of electrically conductive column lines disposed over the system substrate, the column lines extending over the system substrate in a column direction different from the row direction defining an array of non-electrically conductive intersections between the row lines and the column lines;
an array of electrically conductive line segments disposed over the system substrate, the line segments extending over the system substrate substantially parallel to the row direction, the line segments having a line segment length that is less than the distance between adjacent column lines, and each line segment electrically connected to a column line;
one or more devices electrically connected to each row line and to each line segment adjacent to the row line; and
wherein the devices comprise a substrate and first and second electrically conductive connection posts protruding from the system substrate, the first posts forming the electrical connection between the device and the row line and the second post forming the electrical connection between the device and the line segment.

23. The system of claim 22, wherein the row line and the line segment are disposed on or in the surface of the system substrate and wherein the first or second connection posts extend onto, into, or through the row line or line segment, respectively.

24. The system of claim 22, wherein the row line and the line segment are disposed on or in the surface of the system substrate and wherein the first or second connection posts are soldered to the row line or the line segment, respectively.

25. The system of claim 22, comprising a non-conductive adhesive adhering the device to the system substrate, to the row line, or to the column line.

26. A repairable matrix-addressed system, comprising:
a system substrate;
an array of electrically conductive row lines disposed over the system substrate, the row lines extending over the system substrate in a row direction;
an array of electrically conductive column lines disposed over the system substrate, the column lines extending over the system substrate in a column direction different from the row direction defining an array of non-electrically conductive intersections between the row lines and the column lines;
an array of electrically conductive line segments disposed over the system substrate, the line segments extending over the system substrate substantially parallel to the row direction, the line segments having a line segment length that is less than the distance between adjacent column lines, and each line segment electrically connected to a column line;
one or more devices electrically connected to each row line and to each line segment adjacent to the row line; and
contact pads on the system substrate electrically connected to the row lines or the line segments and the devices are electrically connected to the contact pads.

27. A method of making a repairable matrix-addressed system, comprising:
providing a system substrate:
 i) having an array of electrically conductive row lines disposed over the system substrate, the row lines extending over the system substrate in a row direction;
 ii) having an array of electrically conductive column lines disposed over the system substrate, the column lines extending over the system substrate in a column direction different from the row direction defining an array of non-electrically conductive intersections between the row lines and the column lines; and
 iii) having an array of electrically conductive line segments disposed over the system substrate, the line segments extending over the system substrate substantially parallel to the row direction, the line segments having a line segment length that is less than the distance between adjacent columns, and each line segment electrically connected to a column line;
disposing one or more devices on the system substrate so that the one or more devices are electrically connected to each row line and to each line segment; and
testing the devices to determine any failed device and adding an additional device between the line segment and row line corresponding to any failed device.

28. The system of claim 1, wherein each of the one or more devices comprises:
a controller and one or more light-emitting diodes controlled by the controller.

29. The system of claim 13, wherein the adhesive is at least partially disposed between the first and second posts.

30. The system of claim 1, wherein the devices are bare die, integrated circuits, unpackaged integrated circuits, transducers, light emitters, light-emitting diodes, micro-light-emitting diodes, sensors, capacitive sensors, touch sensors, photo-sensors, electromagnetic radiation sensors, or piezo-electric sensors.

31. The system of claim 1, wherein the devices are modules including one or more electrically or optically connected elements having element substrates and wherein the elements include one or more bare die, integrated circuits, unpackaged integrated circuits, transducers, light emitters, light-emitting diodes, micro-light-emitting diodes, sensors, capacitive sensors, touch sensors, photo-sensors, electromagnetic radiation sensors, or piezo-electric sensors, the module having a module substrate separate from the element substrates.

* * * * *